United States Patent
Liu et al.

(10) Patent No.: US 11,029,601 B2
(45) Date of Patent: Jun. 8, 2021

(54) POSITIVE TONE PHOTOPATTERNABLE SILICONE

(71) Applicant: Dow Silicones Corporation, Midland, MI (US)

(72) Inventors: Lizhi Liu, Pearland, TX (US); Peng-Fei Fu, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 0 days.

(21) Appl. No.: 16/969,096

(22) PCT Filed: Feb. 4, 2019

(86) PCT No.: PCT/US2019/016454
§ 371 (c)(1),
(2) Date: Aug. 11, 2020

(87) PCT Pub. No.: WO2019/209395
PCT Pub. Date: Oct. 31, 2019

(65) Prior Publication Data
US 2021/0033973 A1    Feb. 4, 2021

Related U.S. Application Data

(60) Provisional application No. 62/661,797, filed on Apr. 24, 2018.

(51) Int. Cl.
G03F 7/075     (2006.01)
G03F 7/004     (2006.01)
G03F 7/20      (2006.01)

(52) U.S. Cl.
CPC .......... *G03F 7/0757* (2013.01); *G03F 7/0045* (2013.01); *G03F 7/0755* (2013.01); *G03F 7/2002* (2013.01)

(58) Field of Classification Search
CPC .............................. G03F 7/0757; G03F 7/0755
See application file for complete search history.

(56) References Cited

U.S. PATENT DOCUMENTS

| | | | |
|---|---|---|---|
| 5,789,460 A * | 8/1998 | Harkness | G03F 7/0757 522/148 |
| 9,690,197 B2 | 6/2017 | Araki et al. | |
| 2003/0235383 A1 | 12/2003 | Gardner et al. | |
| 2005/0123854 A1 | 6/2005 | Ogata et al. | |
| 2009/0317608 A1 | 12/2009 | Furukawa | |
| 2013/0216952 A1 | 8/2013 | Yokoyama et al. | |
| 2013/0341671 A1 * | 12/2013 | Ona | H01L 33/56 257/100 |
| 2016/0312089 A1 | 10/2016 | Kouno et al. | |

FOREIGN PATENT DOCUMENTS

| | | |
|---|---|---|
| EP | 2116900 | 11/2009 |
| EP | 2677005 | 12/2013 |
| EP | 3081612 | 10/2016 |
| WO | WO-2006132672 A2 * | 12/2006 ............. B82Y 40/00 |

OTHER PUBLICATIONS

Suyama et al "Photobase generators: Recent progress and application trend in polymer systems", Progress in Polymer Science vol. 34, year 2009, pp. 194-209 from : www.elsevier.com/locate/ppolysci (Year: 2009).*

Poly(dimethylsiloxane), vinyl terminated average Mw ~ 25,000, 850-1,150cSt 25° C. | 68083-19-2 | Sigma-Aldrich , 4 pages down loatd from USA Home Mar. 2021 (Year: 2021).*

* cited by examiner

*Primary Examiner* — Cynthia Hamilton

(57) ABSTRACT

A method for producing a patterned silicone layer; said method comprising steps of: (a) depositing on a substrate a composition comprising: (i) a polysiloxane comprising alkenyl groups, (ii) a silane crosslinker comprising silicon-hydrogen bonds, (iii) a hydrosilylation catalyst, and (iv) a photolatent amine generator, to form an uncured resin; (b) exposing the uncured resin to ultraviolet light or electron beam irradiation through a mask to produce a patterned resin; (c) heating the patterned resin; and (e) removing at least a part of the uncured portion of the patterned resin to produce a final patterned silicone layer.

7 Claims, No Drawings

POSITIVE TONE PHOTOPATTERNABLE SILICONE

This invention relates to a method for a silicone material capable of being removed in regions exposed to light.

Common photopatternable silicone compositions (PPS) are negative tone, i.e., the area exposed to ultraviolet light or electron beam irradiation cures and the unexposed area is removed, for example, see U.S. Pat. No. 9,690,197.

Positive tone photopatternable compositions would be useful, where portions of a coating of the composition that are exposed to irradiation are prevented from subsequent curing (and, hence, remain removable) while unexposed portion of the coating remain curable and become non-removable upon subsequent curing. Such a positive tone photopatternable composition would be even more desirably if cure times for unexposed composition was on the order of minutes instead of hours.

STATEMENT OF THE INVENTION

The present invention solves the problem of providing a positive tone photopatternable composition where portions of a coating of the composition that are exposed to irradiation are prevented from subsequent curing (and, hence, remain removable) while unexposed portion of the coating remain curable and become non-removable upon subsequent curing. Moreover, the positive tone photopatternable composition has cure times for unexposed composition was on the order of minutes instead of hours.

The present invention provides a composition comprising: (i) a polysiloxane comprising alkenyl groups, (ii) a silane crosslinker comprising silicon-hydrogen bonds, (iii) a hydrosilylation catalyst, and (iv) a photolatent amine generator; wherein the composition comprises no more than 5 wt % siloxane units having epoxy groups based on weight of composition solids.

The present invention further provides a method for producing a patterned silicone layer; said method comprising steps of: (a) depositing on a substrate a composition comprising: (i) a polysiloxane comprising alkenyl groups, (ii) a silane crosslinker comprising silicon-hydrogen bonds, (iii) a hydrosilylation catalyst, and (iv) a photolatent amine generator, to form an uncured resin; (b) exposing the uncured resin to ultraviolet light or electron beam irradiation through a mask to produce a patterned resin; (c) heating the patterned resin; and (d) removing at least a part of the uncured portion of the patterned resin to produce a final patterned silicone layer.

DETAILED DESCRIPTION

Percentages are weight percentages (wt %) and temperatures are in ° C. unless specified otherwise. Operations were performed at room temperature unless specified otherwise. An "organic substituent group" comprises carbon and hydrogen atoms, and may also contain heteroatoms selected from oxygen, nitrogen, silicon, sulfur, phosphorus, bromine, chlorine and fluorine. Preferably, an organic substituent group comprises no more than three oxygen, nitrogen and silicon atoms, preferably no more than two, preferably no more than one, preferably none. A "hydrocarbyl" group is a substituent derived from an aliphatic or aromatic hydrocarbon, which may be linear, branched or cyclic and which may have one or more substituents selected from chloro, fluoro, methyl, ethyl, methoxy and ethoxy. Preferably, hydrocarbyl groups are unsubstituted. Alkyl groups are saturated hydrocarbyl groups that may be straight or branched. Preferably, alkyl groups have from one to six carbon atoms, preferably one or two. Preferably, alkyl groups are unsubstituted. Aryl groups are substituent groups derived from aromatic hydrocarbon compounds which can be mono- or poly-nuclear, and which can have up to three nitrogen atoms substituted for carbon atoms, preferably no more than two, preferably no more than one, preferably none. Aryl groups may be substituted by chloro, fluoro, methyl, ethyl, methoxy or ethoxy groups, unless specified otherwise herein. Preferably, aryl groups are unsubstituted.

The acronyms such as MQ, MDTQ, etc. as they relate to silicone resins are derived from the symbols M, D, T, and Q, each of which represent a structural unit which may be present in silicone resins containing siloxane units joined by Si—O—Si bonds. Monofunctional (M) unit represents $(R)_3SiO_{1/2}$, where each R is independently selected from hydrogen and alkyl groups. Difunctional (D) unit represents $(R)_2SiO_{2/2}$, where each R is independently selected from hydrogen and alkyl groups. Trifunctional (T) unit represents $RSiO_{3/2}$, where R is selected from hydrogen and alkyl groups and results in the formation of branched linear siloxanes. Tetrafunctional (Q) unit represents $SiO_{4/2}$ which results in the formation of resinous silicone compositions. The resins consist of the siloxane units of represented by the single letters. A siloxane unit type having one or more reactive groups (such as an epoxy group, an acrylate group, a thiol group, an alkenyl group, a vinyl ether group, an amino group, a fluoro group, or any combination(s) thereof) may be designated by a "'" (prime symbol) combined with the single letter designation.

As used herein, unless otherwise indicated, molecular weights, number average molecular weight ($M_n$), weight average molecular weight ($M_w$) and z-average molecular weight ($M_z$) have the conventional meanings and are determined by gel permeation chromatography. Determine molecular weight by gel permeation chromatography using a Water 2695 Separations Module equipped with a vacuum degasser, and a Waters 410 differential refractometer. Conduct the separation with two 300 millimeters by 7.5 millimeters Polymer Laboratories PLgel 5-micrometer Mixed-C columns (molecular eight separation range of 200 to 2,000,000), preceded by a PLgel 5-micrometer guard column (50 millimeters by 7.5 millimeters). Perform the analysis using certified grade tetrahydrofuran (THF) flowing at 1.0 milliliters per minute as the eluent and with the columns and detector at 35° C. Prepare samples in THF at approximately 0.5% w/v solids, and solvate for approximately three hours with occasional shaking followed by filtering through a 0.45 micrometer polytetrafluoroethylene syringe filter prior to analysis. Use and injection volume of 100 microliters and collect data for 25 minutes. For data collection and analysis use ThermoLabsystems Atlas chromatography software and Polymer Laboratories Cirrus BPC software. Determine molecular weight averages relative to a calibration curve ($3^{rd}$ order) created using polystyrene standards covering the molecular weight range of 580 to 2,300,000. Molecular weights are reported herein in units of g/mol. Refractive indices are measured at 20° C. at the sodium D-line (589 nm).

Preferably, the substrate is silicon, glass, polyimide or FR4 board (FR4 is a glass fiber epoxy laminate). Preferably, the substrate is substantially planar, e.g., wafer, board, disk or film.

Preferably, the polysiloxane comprising alkenyl groups comprises from 0.1 wt % or more, preferably at least 0.5 wt %, preferably at least 1 wt %, preferably at last 2 wt % while at the same time preferably comprises 30 wt % or less, preferably no more than 20 wt %, preferably no more than 15 wt %, preferably no more than 10 wt % alkenyl groups (CH=CH$_2$, CH=CH) with wt % relative to weight of polysiloxanes comprising alkenyl groups. Preferably, the polysiloxane comprising alkenyl groups is an alkenyl-terminated polysiloxane, a vinyl-substituted MQ resin or a combination thereof. Preferably, the alkenyl-terminated polysiloxane comprises units of $R^1R^2SiO_{2/2}$ and alkenyl end groups. Preferably, $R^1$ and $R^2$ independently represent $C_1$-$C_{20}$ organic substituent groups, preferably $C_1$-$C_{20}$ substituted or unsubstituted hydrocarbyl groups; preferably alkyl, alkenyl or aryl groups; preferably $C_1$-$C_{12}$ alkyl or $C_6$-$C_{20}$ aryl, preferably $C_6$-$C_{10}$ aryl or $C_1$-$C_4$ alkyl, preferably methyl or phenyl, preferably methyl. Preferably, the alkenyl-terminated polysiloxane comprises from 20 to 1000 units of $R^1R^2SiO_{2/2}$, preferably at least 50, preferably at least 70; preferably no more than 700, preferably no more than 500, preferably no more than 300, preferably no more than 200.

Preferably, the vinyl-substituted MQ resin comprises M units having alkenyl groups ("$M^{Vi}$" units), M units having hydrocarbyl groups and Q units. Preferably the vinyl-substituted MQ resin comprises from 1 to 20 mole % $M^{Vi}$ units, preferably at least 2 mole %, preferably at least 3 mole %; preferably no more than 15 mole %, preferably no more than 10 mole %, preferably no more than 8 mole %. Preferably, the vinyl-substituted MQ resin comprises from 30 to 80 mole % Q units, preferably at least 40 mole %, preferably at least 45 mole %, preferably at least 50 mole %; preferably no more than 75 mole %, preferably no more than 70 mole %, preferably no more than 65 mole %. Preferably, the vinyl-substituted MQ resin comprises from 15 to 55 mole % M units, preferably at least 20 mole %, preferably at least 25 mole %, preferably at least 30 mole %; preferably no more than 50 mole %, preferably no more than 45 mole %, preferably no more than 40 mole %. Mole % are based on moles of vinyl-substituted MQ resin.

The silane crosslinker is a compound having at least three silicon-hydrogen bonds or a polymer having from 0.01 to 2.0 wt % SiH units. In some embodiments, a silane crosslinker compound has four silicon-hydrogen bonds. Preferably, a silane crosslinker has a molecular weight of 200 or more, preferably 250 or more, preferably 300 or more, while at the same time 5000 or less, preferably 2000 or less, preferably 1000 or less and can be 500 or less. Preferably, the silicon-hydrogen bonds connect to different silicon atoms. Preferably, the silane crosslinker compound has formula $Si(OSiR_2H)_4$, where R is $C_1$-$C_6$ alkyl, preferably $C_1$-$C_4$ alkyl, preferably methyl or ethyl, preferably methyl. Preferably, the silane crosslinker polymer has formula MM'DD', MM'T, MM'Q or MM'DD'TQ. Preferably, a silane crosslinker polymer has at least 0.05 wt %, preferably at least 0.1 wt %, preferably at least 0.3 wt % and at the same time preferably no 1.7 wt % or less, preferably 1.5 wt % or less, preferably 1.3 wt % or less, preferably 1.1 wt % or less, preferably 0.9 wt % or less SiH units based on silane crosslinker weight. Preferred silane crosslinker polymers include $MD_aD^H{}_bM$, wherein a is from 0.5 to 10 (preferably 1 to 6) and b is from 2 to 10 (preferably 3 to 9) and "$D^H$" refers to a difunctional D unit where at least one R is a hydrogen.

Preferably, the hydrosilylation catalyst is a platinum compound or complex, e.g., $H_2PtCl_6$, di-μ-carbonyldi-π-cyclopentadienyldinickel, a platinum-carbonyl complex, a platinum-divinyltetramethyldisiloxane complex, a platinum cyclovinylmethylsiloxane complex and platinum acetylacetonate (acac). Other typical hydrosilylation catalysts include nickel and rhodium compounds, e.g., $Rh(acac)_2(CO)_2$ and $Ni(acac)_2$. Preferably, the hydrosilylation catalyst is present in the composition in an amount from 0.5 to 50 ppm, preferably at least 1 ppm, preferably at least 2 ppm, preferably at least 5 ppm, preferably at least 10 ppm; preferably no more than 40 ppm, preferably no more than 30 ppm, preferably no more than 10 ppm, preferably no more than 8 ppm based on weight of the composition.

A photolatent amine generator is a chemical compound that generates free amines upon the photo-irradiation. Examples of suitable photolatent amine generators include those having structures (I)-(IV):

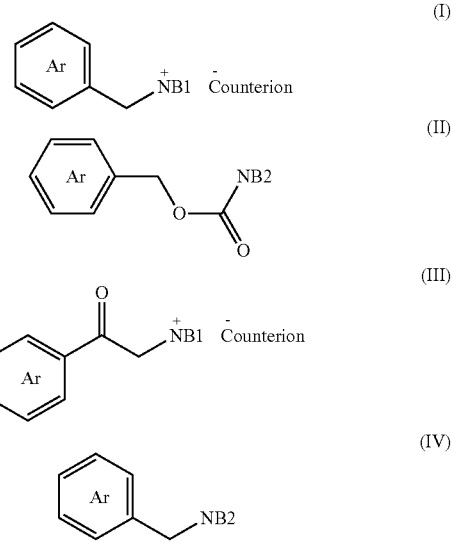

wherein NB1 designates a cyclic or acyclic tertiary amine, NB2 designates a primary or secondary amine and Ar designates a substituted or unsubstituted aryl group. Preferably, Ar comprises from 5 to 20 carbon atoms, preferably 6 to 15; preferred Ar groups include phenyl, 2-nitrophenyl, 4-nitrophenyl, 2-methoxyphenyl, 4-methoxyphenyl, 2-hydroxyphenyl, 4-hydroxyphenyl, naphthalenyl, anthrancenyl and thioxanthone radical. The structures of photolatent amine generators shown above may also include alkyl, aryl or aralkyl groups on the methylene carbon in any of the structures (e.g., see structures of IRGACURE compounds below). Preferably, each of NB1 and NB2 comprises from 5 to 30 carbon atoms, preferably from 6 to 25. The counterion is any anion which forms a salt which is stable in the polysiloxane composition. Preferred counterions include $(Ph)_4B^-$ (Ph=phenyl), $BF_4^-$, $B(C_6F_5)_4^-$, $PF_6^-$, $SbF_6^-$, $ClO_4^-$, carboxylate and phenylglyoxylate. Preferred nitrogen bases (NB1, NB2) include those having the following structures:

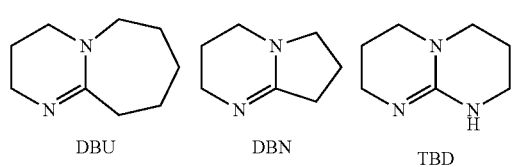

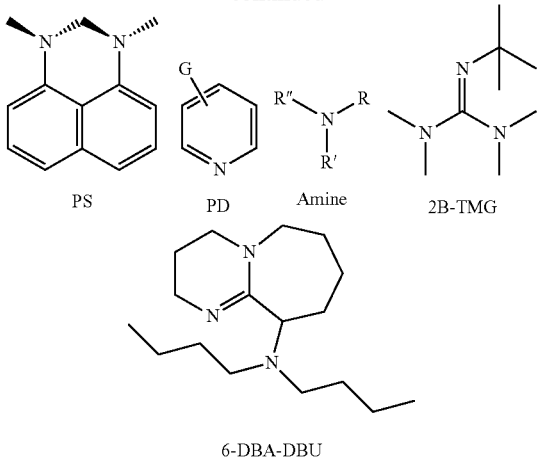

where DBU is 1,8-diazabicyclo[5.4.0]undec-7-ene; DBN is 1,5-diazabicyclo[4.3.0]non-5-ene; TBD is 1,5,7-triazabicyclo[4.4.0]dec-5-ene; PS: proton sponge; 2B-TMG is 2-tert-butyl-1,1,3,3-tetramethylguanidine; 6-DBA-DBU is 6-dibutylamino-DBU; PD is pyridine derivatives, G stands for any substitution groups in any positions of pyridine ring; Amine refers to alkyl amines; R, R' and R" are independently hydrogen, $C_1$-$C_{30}$ hydrocarbyls or two of R, R' and R" join to form an aliphatic ring. Photolatent amine generators may be purchased from commercial sources, such as IRGACURE 907 and IRGACURE 369 from BASF, which are shown below:

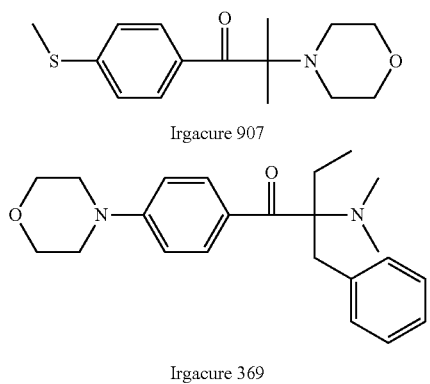

Preferably, the composition comprises from 70 to 99 wt % of polysiloxane(s) comprising alkenyl groups, preferably at least 80 wt %, preferably at least 85 wt %, preferably at least 90 wt %; preferably no more than 97 wt %, preferably no more than 96 wt %, preferably no more than 95 wt %. Preferably, the composition comprises from 0.5 to 20 wt % of silane crosslinker(s), preferably at least 1 wt %, preferably at least 2 wt %; preferably no more than 15 wt %, preferably no more than 10 wt %, preferably no more than 8 wt %. Preferably, the composition comprises from 0.1 to 20 wt % of photolatent amine generator(s), preferably at least 0.2 wt %, preferably at least 0.5 wt %, preferably at least 1 wt %; preferably no more than 15 wt %, preferably no more than 10 wt %, preferably no more than 8 wt %, preferably no more than 5 wt %.

Preferably, the composition comprises no more than 3 wt % siloxane units having epoxy groups, preferably no more than 2 wt %, preferably no more than 1 wt %, preferably no more than 0.5 wt %, preferably no more than 0.1 wt %, preferably no more than 0.01 wt %, preferably none. The percentage of siloxane units having epoxy groups is calculated on a solids basis (that is, composition solids exclusive of any solvent which may be present in the composition).

Preferably, the composition further comprises an inhibitor for hydrosilylation reaction. Inhibitors for hydrosilylation are well known. The inhibitor provides sufficient inhibition for the composition to be processed without gelation. Examples include 1,3 divinyldisiloxane, $(MeViSiO_{2/2})_4$, 2-methyl-3-butynol, 1-ethynyl-1-cyclohexanol. Preferably, the composition comprises from 1 to 500 ppm of inhibitor(s), preferably at least 5 ppm, preferably at least 10 ppm, preferably at least 20 ppm; preferably no more than 300 ppm, preferably no more than 100 ppm.

Preferably, the composition further comprises one or more solvents used to adjust viscosity of the composition. Preferably, solvents have a boiling point of 70 degrees Celsius (° C.) or higher, preferably 80° C. or higher, more preferably 100° C. or higher and can be 120° C. or higher while at the same time is generally 200° C. or lower, preferably 180° C. or lower and can be 170° C. or lower, 160° C. or lower and even 150° C. or lower.

Preferred solvents include aliphatic ketones, ethers, and esters having from 3 to 20 carbon atoms, e.g., methyl ethyl ketone, PGMEA, PGME, MIBK, 2-heptanone, butyl acetate and ethyl lactate. Preferably, the solvent is not aromatic. Preferably, solvent is added to the composition in an amount up to 20 wt % of the total amount of components (i), (ii), (iii) and (iv); preferably no more than 15 wt %. Adjusting the solvent to attain a target viscosity is well within the capability of one skilled in the art.

In steps (c), preferably heating is performed so as to achieve a temperature of at least 30° C., preferably at least 50° C., preferably at least 100° C. while at the same time preferably no more than 190° C., preferably no more than 170° C. Heating times to cure the film are easily determined for any film.

Preferably, photo-irradiation via ultraviolet light is performed at a wavelength from 180 nanometers (nm) to 450 nm, preferably 200 to 380 nm. Preferably, the dose level is from 5 to 3000 milliJoules per square centimeter (mJ/cm$^2$), preferably from 50 to 2000 mJ/cm$^2$, preferably from 100 to 1000 mJ/cm$^2$.

Preferably, the thickness of the composition on the substrate is from one micron or more, preferably 30 microns or more and more preferably 50 microns or more while at the same time is desirably 300 microns or less, preferably 200 microns or less and more preferably 170 microns or less.

Preferably, the uncured portion of the composition is removed using a solvent of the type described above.

The compositions of this invention may include optional ingredients such as photosensitizers, fillers, high release additives, reactive diluents, photochromic materials, dyes, colorants, preservatives, and other radiation curable compounds.

EXAMPLES

Example 1: Fully Curable Film in the Absence of Photo-Irradiation

A photobase solution is prepared by combining 0.3 weight-parts of photolatent amine base 2-Benzyl-2-dimethylamino-1-(4-morpholinophenyl)-butanone-1 (IRGACURE 369, supplied by Ciba)—dissolved in 1.2 weight-part parts of Methyl ethyl ketone (MEK) with 9.7 weight parts of a thermally curable silicone formulation to form a solution. The thermally curable silicone formulation contains a difunctional vinyl terminated PDMS fluid (degree of polymerization (DP)=120, 75.0% by wt; for example product DMS-V35 from Gelest; CAS No. 68083-19-2), a vinyl MQ resin (MM'Q, mole ratios 35/5/60, 20.0% wt; for example, Silmer VQ2012 from Siltech; CAS number 68988-89-6), a SiH containing cross-linker (dimethyl and methylhydrogen siloxane copolymer with DP about 10 and SiH %=0.78%, 5.0% by wt; commercially available as HMS-301 from Gelest; CAS No. 68037-59-2), Platinum(0)-1,3-divinyl-1,1, 3,3-tetramethyldisiloxane complex (20 ppm to the siloxane polymers), and 1-ethynyl-1-cyclohexanol (60 ppm to the siloxane polymers). The formulation was shaken vigorously to mix. The formulation was coated on glass slides using doctor blade coater to have 100 µm films. The films dried quickly at ambient conditions. The coated film was put into an oven at 120° C. and it is cured within 5 minutes, demonstrating cure without UV irradiation.

Example 2: Amine-Inhibited Cure after Photo-Irradiation

The same sample is prepared as in Example 1 until the coated film is dried. Then the film was put into a UV chamber and exposed to 500 mJ/cm$^2$ 248 nm UV light. After the exposure the film was put into the oven at 120° C. for 1 hour. The film is still un-cured and remains tacky and can be removed by solvents. This demonstrates inhibition of cure after UV irradiation.

Example 3: Photo-Patterned Film

Mix 1.93 part of vinyl functional MQ resin ($M_{0.37}M'_{0.05}Q_{0.58}$, weight percent vinyl groups is 1.5-2.5% by weight of the vinyl functional MQ resin), 1.0 part of SiH crosslinker polymer containing 0.11% SiH ($MD_{108}D'_{10}M$) and 0.52 part of butyl acetate to form the base curable siloxane formulation. Add 1-ethynyl-1-cyclohexanol (60 ppm to the siloxane) and Pt catalyst (Platinum(0)-1,3-divinyl-1,1,3,3-tetramethyldisiloxane complex, 2 ppm to the siloxane). Then add 0.5 wt % photolatent amine generator 2-Benzyl-2-dimethylamino-1-(4-morpholinophenyl)-butanone-1 (IRGACURE 369, supplied by BASF) dissolved in butyl acetate solvent to have the full formulation. The formulation was spin coated on a silicon wafer at 1000 rpm for 30 seconds (CT62 RC Spin Coater). The film was dried at room temperature for 10 minutes. After drying the film was exposed to 200 mJ/cm$^2$ 248 nm UV light under a mask in a UV chamber. Then the wafer is baked at 150° C. for 2 minutes on a hot plate. After the bake, the wafer was put back on spin coater for solvent development. While the wafer is spinning on the coater, solvent is added onto the wafer to dissolve and spin off the uncured part of the film. After development, a pattern was generated on the wafer.

Example 4: Photo-Patterned Film

Mix 1.93 part of vinyl functional MQ resin ($M_{0.37}M'_{0.05}Q_{0.58}$, Vi %=1.5-2.5% by weight), 1.0 part of SiH crosslinker polymer containing 0.11% SiH ($MD_{108}D'_{10}M$) and 0.52 part of butyl acetate to form the base curable siloxane formulation. Add 1-ethynyl-1-cyclohexanol (60 ppm to the siloxane) and Pt catalyst (Platinum(0)-1,3-divinyl-1,1,3,3-tetramethyldisiloxane complex, 2 ppm to the siloxane). Then add 0.5 wt % photolatent amine generator 2-Methyl-4'-(methylthio)-2-morpholinopropiophenone (IRGACURE 907, supplied by BASF) in butyl acetate solvent to have the full formulation. The formulation was spin coated on a silicon wafer at 1000 rpm for 30 seconds (CT62 RC Spin Coater). The film was dried at room temperature for 10 minutes. After drying the film was exposed to 200 mJ/cm$^2$ 248 nm UV light under a mask in a UV chamber. Then the wafer is baked at 150° C. for 2 minutes on a hot plate. After the bake, the wafer was put back on spin coater for solvent development. While the wafer is spinning on the coater, solvent is added onto the wafer to dissolve and spin off the uncured part of the film. After development, a pattern was generated on the wafer

The invention claimed is:

1. A method for producing a patterned silicone layer; said method comprising steps of: (a) depositing on a substrate a composition comprising: (i) a polysiloxane comprising alkenyl groups, (ii) a silane crosslinker comprising silicon-hydrogen bonds, (iii) a hydrosilylation catalyst, and (iv) a photolatent amine generator, to form an uncured resin; (b) exposing the uncured resin to ultraviolet light or electron beam irradiation through a mask to produce a patterned resin; (c) heating the patterned resin; and (d) removing at least a part of the uncured portion of the patterned resin to produce a final patterned silicone layer.

2. The method of claim 1 in which the polysiloxane comprising alkenyl groups comprises from 0.5 to 20 wt % alkenyl groups.

3. The method of claim 2 in which the polysiloxane comprising alkenyl groups is an alkenyl-terminated polysiloxane, a vinyl-substituted MQ resin or a combination thereof.

4. The method of claim 3 in which the silane crosslinker is a compound having at least three silicon-hydrogen bonds or a polymer having from 0.01 to 2.0 wt % SiH.

5. The method of claim 4 in which the alkenyl-terminated polysiloxane comprises units of $R^1R^2SiO_{2/2}$ and alkenyl end groups; wherein $R^1$ and $R^2$ independently represent $C_1$-$C_{20}$ substituted or unsubstituted hydrocarbyl groups.

6. A composition comprising (i) a polysiloxane comprising alkenyl groups, (ii) a silane crosslinker comprising silicon-hydrogen bonds, (iii) a hydrosilylation catalyst, and (iv) a photolatent amine generator; wherein the composition comprises no more than 0.1 wt % siloxane units having epoxy groups based on weight of composition solids; wherein the polysiloxane comprising alkenyl groups comprises from 0.5 to 20 wt % alkenyl groups; and wherein the polysiloxane comprising alkenyl groups is (A) an alkenyl-terminated polysiloxane that comprises units of $R^1R^2SiO_{2/2}$ and alkenyl end groups, wherein $R^1$ and $R^2$ independently represent $C_1$-$C_{20}$ substituted or unsubstituted hydrocarbyl groups, (B) a vinyl-substituted MQ resin; or (C) a combination thereof; and wherein the silane crosslinker is a compound having at least three silicon-hydrogen bonds or a polymer having from 0.01 to 2.0 wt % SiH.

7. The composition of claim 6, wherein the polysiloxane comprising alkenyl groups is a difunctional vinyl-terminated polydimethylsiloxane, a vinyl-substituted MQ resin or a combination thereof.

* * * * *